United States Patent
Kashiwagi

(10) Patent No.: US 8,420,762 B2
(45) Date of Patent: Apr. 16, 2013

(54) SILICONE RESIN COMPOSITION AND A CURED PRODUCT THEREOF

(75) Inventor: Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 227 days.

(21) Appl. No.: 12/973,534

(22) Filed: Dec. 20, 2010

(65) Prior Publication Data
US 2011/0147955 A1 Jun. 23, 2011

(30) Foreign Application Priority Data

Dec. 21, 2009 (JP) ................... 2009-289507
Dec. 1, 2010 (JP) ................... 2010-268699

(51) Int. Cl.
*C08G 77/12* (2006.01)
(52) U.S. Cl.
USPC ............................................. 528/31; 528/32
(58) Field of Classification Search ............ 528/31, 528/32
See application file for complete search history.

(56) References Cited

U.S. PATENT DOCUMENTS

2009/0263936 A1    10/2009  Fujisawa et al.
2010/0216930 A1*   8/2010   Ihara et al. ............ 524/430

FOREIGN PATENT DOCUMENTS

| JP | 7-292343 A | 11/1995 |
| JP | 2007-63299 A | 3/2007 |
| WO | 2009 008452 | * 1/2009 |
| WO | 2009 051009 | * 4/2009 |

* cited by examiner

*Primary Examiner* — Kuo-Liang Peng
(74) *Attorney, Agent, or Firm* — Birch, Stewart, Kolasch & Birch, LLP

(57) ABSTRACT

The present invention provides a silicone resin composition comprising (A) an organopolysiloxane having at least two alkenyl groups, (B) an organohydrogenpolysiloxane having at least two hydrogen atoms each bonded to a silicon atom, (C) a catalyst comprising a platinum group metal, (D) fine silicone particles, and (E) a (meth)acrylate compound. The present silicone resin composition cures in a short time to form a cured product having excellent adhesion strength with solder resists and copper substrates.

6 Claims, No Drawings

SILICONE RESIN COMPOSITION AND A CURED PRODUCT THEREOF

CROSS REFERENCES

This application claims the benefits of Japanese Patent Application No. 2009-289507 filed on Dec. 21, 2009 and Japanese Patent Application No. 2010-268699 filed on Dec. 1, 2010, the contents of which are incorporated herein by reference.

FIELD OF THE INVENTION

The present invention relates to a silicone resin composition, in particular, a silicone resin composition which is excellent in adhesion to solder resists or copper substrates and cures rapidly to provide a cured product of the composition, and to a cured product thereof.

BACKGROUND OF THE INVENTION

Silicone resin compositions give cured products which have excellent properties such as weather resistance and heat resistance as well as rubbery properties such as hardness and elongation and, therefore, are used as low elastic die-bonding agents for bonding substrates of various semiconductors of a CSP structure to chips.

The following Patent Literature 1 describes an insulating liquid die-bonding agent for bonding a semiconductor chip to a chip-mounting member, wherein the agent comprises a relatively hard filler so as to ensure insulation between the afore-mentioned semiconductor chip and the chip-mounting member and not to damage wire bondability to the semiconductor chip after die bonding.

The following Patent Literature 2 describes an insulating liquid die-bonding agent, wherein the agent is less likely to damage an active surface of a semiconductor chip, good for screen printing, less likely to generate voids on the interface between the semiconductor chip and the die-bonding agent, and does not disturb wire bonding.

PRIOR LITERATURES

Patent Literatures

Patent Literature 1: Japanese Patent Application Laid-Open No. Hei-7-292343
Patent Literature 2: Japanese Patent Application Laid-Open No 2007-063299

SUMMARY OF THE INVENTION

Problems to be Solved by the Invention

Generally, a die-bonding process causes cure by heating at a temperature of 150 degrees C. or higher for one to several seconds. It is desired to shorten a curing time to increase the productivity. The afore-mentioned die-bonding agents have a slow curing speed and take time in die bonding. These die-bonding agents are not satisfactory in adhesion to semiconductor substrates such as solder resists, polyimide films, copper foils, passivation and photo-sensitive plastic substrates.

The present invention has been made in the consideration of the afore-mentioned problems. The purpose of the present invention is to provide a silicone resin composition which cures in a short time to form a cured product having excellent adhesion strength with solder resists and copper substrates.

Means to Solve the Problems

The inventors have found that a silicone resin composition comprising a (meth)acrylate compound has accelerated curing speed of a resin and provide a cured product having good adhesion to substrates and that particular fine silicone particles lower an internal stress in the cured product of the silicone resin composition to further improve the adhesion to substrates.

Namely, the present invention is a silicone resin composition comprising
(A) an organopolysiloxane having at least two alkenyl groups in a molecule,
(B) an organohydrogenpolysiloxane having, in a molecule, at least two hydrogen atoms each bonded to a silicon atom in such an amount that a ratio of a total mole of the hydrogen atoms bonded to the silicon atom in component (B) to a total mole of the alkenyl groups in component (A) is 0.1 to 4.0,
(C) a catalytic amount of a catalyst comprising a platinum group metal,
(D) fine silicone particles having an average particle size of 0.1 to 100 micrometers in an amount of 30 to 80 parts by mass, relative to total 100 parts by mass of components (A) and (B), and
(E) a (meth)acrylate compound in an amount of 0.01 to 10 parts by mass, relative to total 100 parts by mass of components (A) and (B).

Effects of the Invention

The present silicone resin composition comprises (meth)acrylate and particular fine silicone particles and, therefore, can cure in a short time to form a cured product which has an excellent adhesion to solder resists or copper substrates.

BEST MODE OF THE INVENTION

(A) Organopolysiloxane Having an Alkenyl Group

A base component of the present invention, organopolysiloxane having an alkenyl group (A), preferably has a viscosity at 25 degrees C. of 10 to 1,000,000 mPa·s, more preferably 100 to 100,000 mPa·s, most preferably 500 to 10,000 mPa·s for easy handling and curability. The organopolysiloxane has at least 2, more preferably 2 to 50, alkenyl groups preferably having 2 to 8, particularly 2 to 6, carbon atoms. The alkenyl group is preferably linear. The organopolysiloxane preferably has a main chain composed of repeated dioraganosiloxane units and, more preferably, both ends of the molecular chain are capped with a triorganosiloxy group. Particularly, desired is a linear organopolysiloxane represented by the following general formula (1),

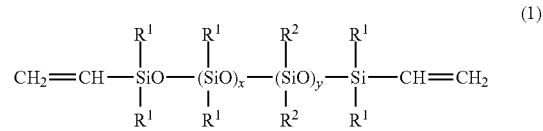

wherein x and y are 0 or a positive integer and a total of x and y is such as to give a viscosity at 25 degrees C. of 10 to 1,000,000 mPa·s. Such x and y satisfy the equation $0 < x + y \leq 10,000$, preferably, the equations $5 < x + y \leq 2,000$ and $0 \leq x/(x+y) \leq 1.0$. The linear organopolysiloxane may comprise a small amount of branched structure in its molecular chain. The viscosity of the organopolysiloxane can be determined with a rotational viscometer.

In the afore-mentioned formula, $R^1$ is, independently of each other, an unsubstituted or substituted monovalent hydrocarbon group. The monovalent hydrocarbon group preferably has 1 to 10, in particular 1 to 6, carbon atoms. Examples of the monovalent hydrocarbon group include alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, tolyl, xylyl, and naphtyl groups; aralkyl groups such as benzyl, phenylethyl, and phenylpropyl groups; alkenyl groups such as vinyl, allyl, propenyl, isopropenyl, butenyl, hexenyl, cyclohexenyl, and octenyl groups; and those groups where a part or whole of their hydrogen atoms each bonded to a carbon atom are replaced with a halogen atom(s), such as fluorine, bromine and chlorine atoms or a cyano group, such as halogen-substituted alkyl groups, for instance, chlormethyl, chloropropyl, bromoethyl, and trifluoropropyl groups, and a cyanoethyl group.

In the afore-mentioned formula, $R^2$ is, independently of each other, an unsubstituted or substituted, monovalent hydrocarbon group having no aliphatic unsaturated bond. The monovalent hydrocarbon group preferably has 1 to 10, in particular 1 to 6, carbon atoms. Examples of the monovalent hydrocarbon groups include alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, tolyl, xylyl, and naphtyl groups; aralkyl groups such as benzyl, phenylethyl and phenylpropyl groups; and those groups where a part or whole of their hydrogen atoms each bonded to a carbon atom are replaced with a halogen atom(s), such as fluorine, bromine and chlorine atom, or a cyano group, such as a halogen substituted alkyl group, such as chlormethyl, chloropropyl, bromoethyl, and trifluoropropyl groups, and cyanoethyl group.

The examples of the organopolysiloxanes include the following.

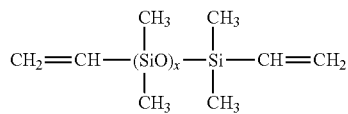

-continued

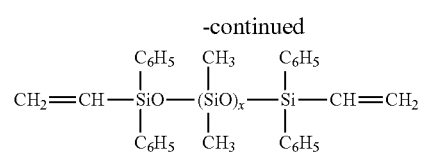

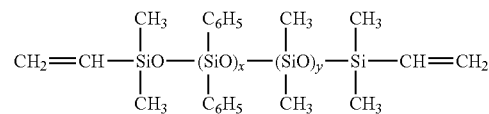

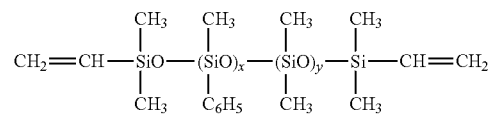

In the afore-mentioned formulas, x and y are as defined above.

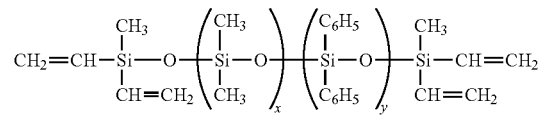

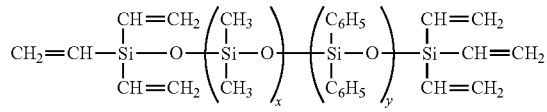

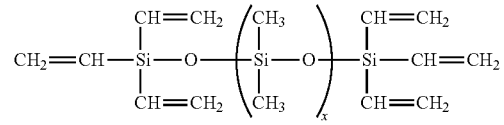

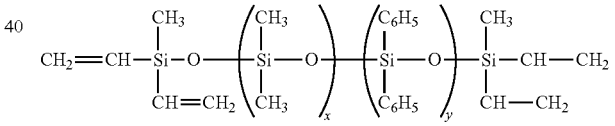

In the afore-mentioned formulas, x and y are as defined above.

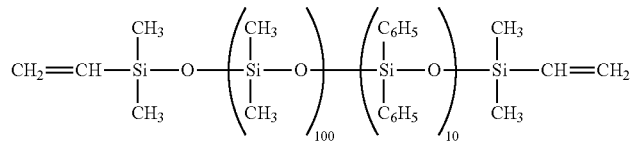

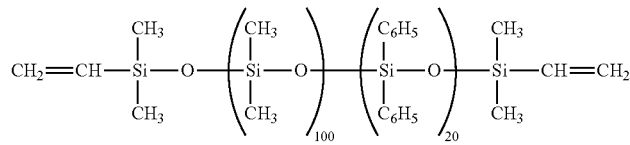

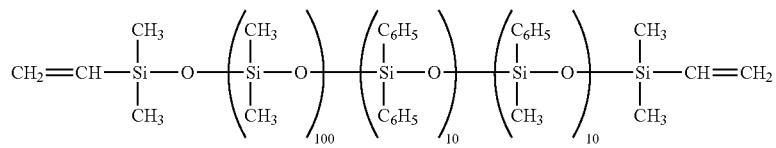

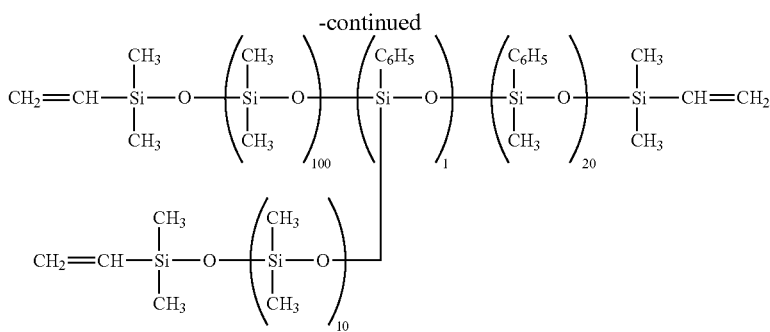

Component (A) of the present invention may be a mixture of the organopolysiloxane having a resin structure, namely, three dimensional network structure, with the organopolysiloxane represented by formula (1). The organopolysiloxane having a resin structure is preferably comprises an $SiO_2$ unit, an $R^3{}_k R^4{}_p SiO_{0.5}$ unit and an $R^4{}_3 SiO_{0.5}$ unit, wherein $R^3$ is a vinyl or allyl group, $R^4$ is a monovalent hydrocarbon group having no alkenyl group, k is 1, 2 or 3, and p is 0, 1 or 2, provided that a total of k and p is 3. $R^4$ is the similar monovalent hydrocarbon group as $R^2$ mentioned above and is preferably a methyl or phenyl group among others.

The $SiO_2$ unit is described as "a"; the $R^3{}_k R^4{}_p SiO_{0.5}$ unit, "b"; and the $R^4{}_3 SiO_{0.5}$ unit, "c", then, a molar ratio, (b+c)/a, is preferably 0.3 to 3, more preferably 0.7 to 1.0; and a molar ratio, b/a, is preferably 0.01 to 1, more preferably 0.07 to 0.15. A weight average molecular weight reduced to polystyrene by GPC of the organopolysiloxane is preferably in the range of 500 to 10,000.

The present organopolysiloxane having a resin structure may comprise small amounts of a bifunctional siloxane unit and trifunctional siloxane unit, namely, organosilsesquioxane unit, in addition to a, b, and c, as long as the purposes of the present invention are not damaged.

The organopolysiloxane having a resin structure can be easily prepared by combining source compounds for a, b, and c so that the afore-mentioned molar ratios are met and, for instance, carrying out co-hydrolysis in the presence of acid.

As the source compound for a, use may be made of sodium silicate, alkyl silicates, polyalkyl silicates and silicon tetrachloride.

As the source compound for b, use may be made of the following:

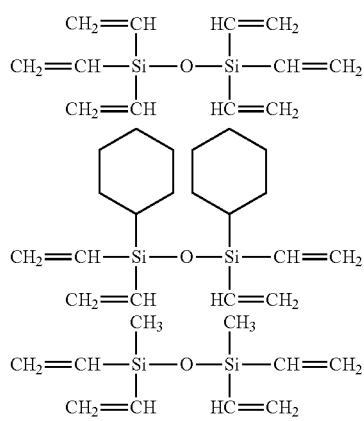

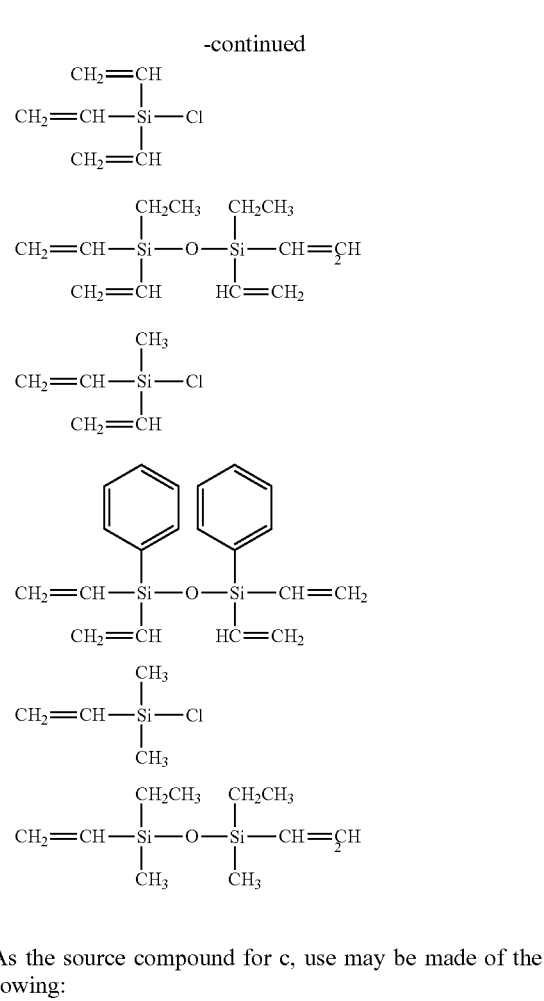

As the source compound for c, use may be made of the following:

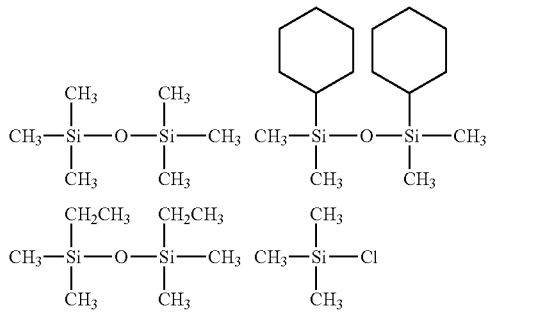

-continued

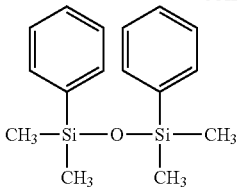

The organopolysiloxane having a resin structure is added to improve physical strength and tackiness of a cured product. This organopolysiloxane is preferably blended in an amount of 20 to 70 mass %, more preferably 30 to 60 mass %, in component A. If the amount of this organopolysiloxane having a resin structure is too small, the afore-mentioned curing may not be attained sufficiently. If the amount is too large, a viscosity of the composition is so high that crack may often occur in a cure product.

(B) Organohydrogenpolysiloxane

The organohydrogenpolysiloxane functions as a cross-linking agent. The SiH groups in this component addition react with the alkenyl groups of component (A) to form a cured product. Any organohydrogenpolysiloxane may be used as long as it has at least two hydrogen atoms each bonded to a silicon atom (referred to as "SiH group") in a molecule. However, particularly preferred one has the following average compositional formula (2), $$H_a R^5_b SiO_{(4-a-b)/2} \quad (2)$$

wherein $R^5$ is, independently of each other, a substituted or unsubstituted, monovalent hydrocarbon atoms having no aliphatic unsaturated bond, a and b are the numbers which satisfy the following equations, $0.001 \leq a < 2$, $0.7 \leq b \leq 2$, and $0.8 \leq a+b \leq 3$, and has at least 2, preferably 3, SiH groups in a molecule.

$R^5$ in the afore-mentioned formula (2) is, independently of each other, preferably a substituted or unsubstituted, monovalent hydrocarbon groups having no aliphatic unsaturated bond and having 1 to 10, in particular 1 to 7, carbon atoms. Examples of $R^5$ include lower alkyl groups such as a methyl group, aryl groups such as a phenyl group, and those mentioned for $R^2$ in the general formula (1). a and b satisfy the following equations, $0.001 \leq a < 2$, $0.7 \leq b \leq 2$ and $0.8 \leq a+b \leq 3$, preferably the equations, $0.5 \leq a \leq 1$, $0.8 \leq b \leq 2$ and $1 \leq a+b \leq 2.7$. The locations of the SiH groups in the molecule are not particularly limited. The SiH groups may be present at the terminal or in a middle part of the molecular chain.

Examples of the organohydrogenpolysiloxanes include tris(dimethylhydrogensiloxy)methyl silane, tris(dimethylhydrogensiloxy)phenylsilane, 1,1,3,3-tetramethyldisiloxane, 1,3,5,7-tetramethylcyclotetrasiloxane, methylhydrogenpolysiloxane with both ends blocked with trimethylsiloxy groups, copolymers of dimethylsiloxane and methylhydrogensiloxane with both ends blocked with trimethylsiloxy groups, dimethylpolysiloxane with both ends blocked with dimethylhydrogensiloxy groups, copolymers of dimethylsiloxane and methylhydrogensiloxane with both ends blocked with dimethylhydrogensiloxy groups, copolymers of methylhydrogensiloxane and diphenylsiloxane with both ends blocked with trimethylsiloxy groups, copolymers of methylhydrogensiloxane, diphenylsiloxane and dimethylsiloxane with both ends blocked with trimethylsiloxy groups, copolymers composed of $(CH_3)_2HSiO_{1/2}$ unit and $SiO_{4/2}$ unit, copolymers composed of $(CH_3)_2HSiO_{1/2}$ unit, $SiO_{4/2}$ unit and $(C_6H_5)SiO_{3/2}$ unit, and copolymers composed of $(CH_3)_2HSiO_{1/2}$ unit and $(C_6H_5)SiO_{3/2}$ unit.

The molecular structure of this organohydrogenpolysiloxane may be any of linear, cyclic, branched and three dimensional network structure. The number of the silicon atoms in one molecule or the degree of polymerization is 3 to 500, preferably 5 to 300, more preferably 10 to 100.

This organohydrogenpolysiloxane can be usually obtained by hydrolyzing $R^5SiHCl_2$, $(R^5)_3SiCl$, $(R^5)_2SiCl_2$, or $(R^5)_2SiHCl$ where $R^5$ is as defined above, or equilibrating the siloxanes resulting from the hydrolysis.

The following is mentioned as the organohydrogenpolysiloxane,

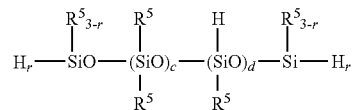

wherein c and d satisfy the following equations, $0 \leq c \leq 498$, $0 < d \leq 498$ and $1 < c+d \leq 498$, preferably the equation, $1 < c+d \leq 98$, r is an integer of 0 to 3, and $R^5$ is as defined above.

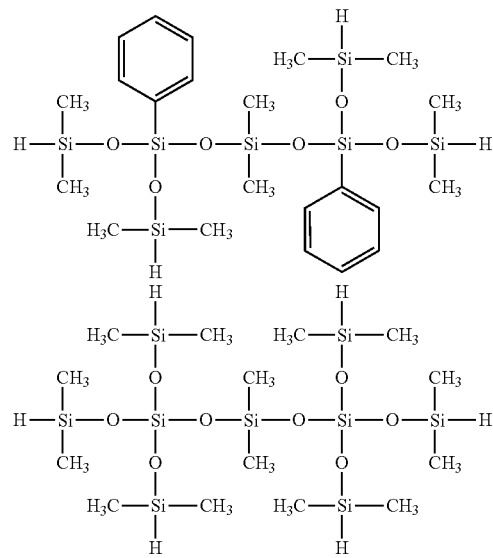

This organohydrogenpolysiloxane is blended in an amount effective to cure component (A), particularly in such an amount as to give an amount of the SiH groups in the organohydrogenpolysiloxane of 0.1 to 4.0 moles, preferably 1.0 to 3.0 moles, more preferably 1.2 to 2.8 moles, per mole of the whole alkenyl groups in component (A). If the amount of component (A) is smaller than the afore-mentioned lower limit, cross-linking does not take place and a cured silicone product may not be obtained. If the amount of component (A) is larger than the afore-mentioned upper limit, a lot of unreacted SiH groups remain in a cured product to cause change in the rubber properties over time. An amount of the phenyl group is preferably 0.2 mole or more relative to 100 grams of components (A) and (B).

(C) A Catalyst Comprising a Platinum Group Metal

The catalyst is blended to cause an addition curing of the present composition. The catalysts may include a metal of the platinum, palladium or rhodium group, but, for costs, preferred are those comprising a metal of the platinum group, such as platinum, platinum black, and chloroplatinic acid. Examples include $B_2PtCl_6 \cdot mH_2O$, $K_2PtCl_6$, $KHPtCl_6 \cdot mH_2O$, $K_2PtCl_4$, $K_2PtCl_4 \cdot mH_2O$, and $PtO_2 \cdot mH_2O$, wherein m is a positive integer, and complexes thereof with a hydrocarbon such as an olefin, an alcohol or a vinyl group-containing organopolysiloxane. For instance, use may be made of a solution of alcohol-modified chloroplatinic acid and a solution of silicone-modified chloroplatinic acid. The afore-mentioned catalysts may be used alone or in a combination thereof.

The catalysts may be used in a so-called catalytic amount, preferably 0.1 to 1000 ppm, more preferably 0.5 to 200 ppm, reduced to a platinum group metal, relative to a total amount of components (A) and (B).

(D) Fine Silicone Particles

Fine silicone particles (D) preferably have an average particle size of 0.1 to 100 micrometers, more preferably 1 to 30 micrometers. Particularly preferred are spherical fine silicone rubber particles which have been coated with a polyorganosilsesquioxane resin as described in Japanese Patent Application Laid-Open No. Hei-7-196815. The spherical fine silicone rubber particles coated with a polyorganosilsesquioxane resin can be prepared by adding an alkaline material or aqueous alkaline solution and organotrialkoxysilane to an aqueous dispersion of the fine silicone particles to carry out hydrolysis and condensation. The fine silicone particles coated with an organopolysilsesquioxane resin provides the silicone resin composition with good flowability, dispersibility, and lubricability and lowers inner stress in the cured silicone resin composition to, thereby, increase adhesion to a substrate.

The fine silicone particles are those obtained by coating spherical fine silicone rubber particles having, in a molecular structure, linear organopolysiloxane units represented by the following formula (3) with a polyorganosilsesquioxane resin,

$$—(R^6{}_2SiO)_n— \quad (3).$$

In the formula (3), examples of $R^6$ include alkyl groups such as methyl, ethyl, propyl and butyl groups; aryl groups such as phenyl and tolyl groups; alkenyl groups such as vinyl and allyl groups; aralkyl groups such as β-phenylethyl and β-phenylpropyl groups; monovalent halogenated hydrocarbon groups such as chloromethyl and 3,3,3-trifluoropropyl groups, and one or more monovalent groups having 1 to 20 carbon atoms and selected from the organic groups having a reactive group such as epoxy, amino, mercapto, acryloxy, and methacryloxy groups. Particularly, 90 mole % or more of $R^6$ is preferably a methyl group. n is the number of 5 to 5,000, preferably 10 to 1,000. If n is less than 5, the characteristics of the linear organopolysiloxane are not sufficiently exerted and, therefore, sufficient reduction in inner stress and improvement in lubricability are not attained. If n is more than 5,000, the preparation of the spherical fine silicone particles is difficult, which is undesirable.

The present fine silicone particles have been subjected to coating with a polyorganosilsesquioxane resin and, then, silylation with vinylsilazane. Silylation with vinyl silazane provides the silicone particles with a cross-linking group (vinyl group), can increase affinity with the siloxane resin, and can improve flowability and lubricability.

An amount of component (D) to be added is 30 to 80 parts by mass, preferably 30 to 60 parts by mass, relative to total 100 parts by mass of components (A) and (B). If the amount of component (D) is larger than the afore-mentioned upper limit, strength of the resin is lower. If the amount of component (D) is smaller than the afore-mentioned lower limit, elasticity is not lowered sufficiently, so that stress in a package may not be relaxed.

(E) (Meth)acrylate Compound (Meth)acrylate compound (E) is preferably compatible with components (A) and (B) to provide a transparent composition. The (meth)acrylate compound may be any monomers, oligomers or polymers of (meth)acrylate compounds, as long as the oligomer or polymer has one or two or more (meth)acryloyl groups in a molecule. The (meth)acrylate compound may be also a polyester, polyether, or polycarbonate compound whose one end and/or both ends are capped with a (meth)acryloyl group.

Component (E) may not have a silicon atom in its molecular structure and may have a hydroxy group and/or an etheric oxygen atom in its ester moiety. Inter alia, preferred are (meth)acrylate compounds having 4 to 30, more preferably 8 to 20, carbon atoms. Specific examples include mono functional (meth)acrylates such as lauryl(meth)acrylate, 2-hydroxy-3-phenoxypropyl(meth)acrylate, diethylene glycol mono(meth)acrylate, triethylene glycol mono(meth)acrylate, and tetraethylene glycol mono(meth)acrylate; and bifunctional (meth)acrylates such as diethylene glycol di(meth)acrylate, triethylene glycol di(meth)acrylate, tetraethylene glycol di(meth)acrylate, 5-ethyl-2-(2-hydroxy-1,1-dimethylethyl)-5-(hydroxyethyl)-1,3-dioxane diacrylate (trade name: Kayarad R-604, ex Nippon Kayaku Co., Ltd.) or its corresponding methacylate, and (octahydro-4,7-methane-1H-indenediyl)bis(methylene) ester of 2-propenoic acid (trade name: Kayarad R-684, ex Nippon Kayaku Co., Ltd.) or its corresponding methacylate.

An amount of component (E) to be added is preferably 0.01 to 10 parts by mass, more preferably, 0.1 to 5 parts by mass, relative to total 100 parts by mass of components (A) and (B). If the amount of component (E) is smaller than the afore-mentioned lower limit, curing in a die-bonding process is impossible in a short time and adhesion to solder resists and copper substrates is worse. If the amount of component (E) is larger than the afore-mentioned upper limit, the properties of the cured product are worse and heat resistance may be adversely affected.

(F) Adhesion Aid

The present silicone resin composition may further comprise an adhesion aid, if necessary, to improve adhesion of the cured product. Any known aid may be used, for instance, those mentioned below. An amount of the adhesion aid to be added is 0.1 to 10 parts by mass, preferably 0.5 to 5 parts by mass, relative to total 100 parts by mass of components (A) to (E).

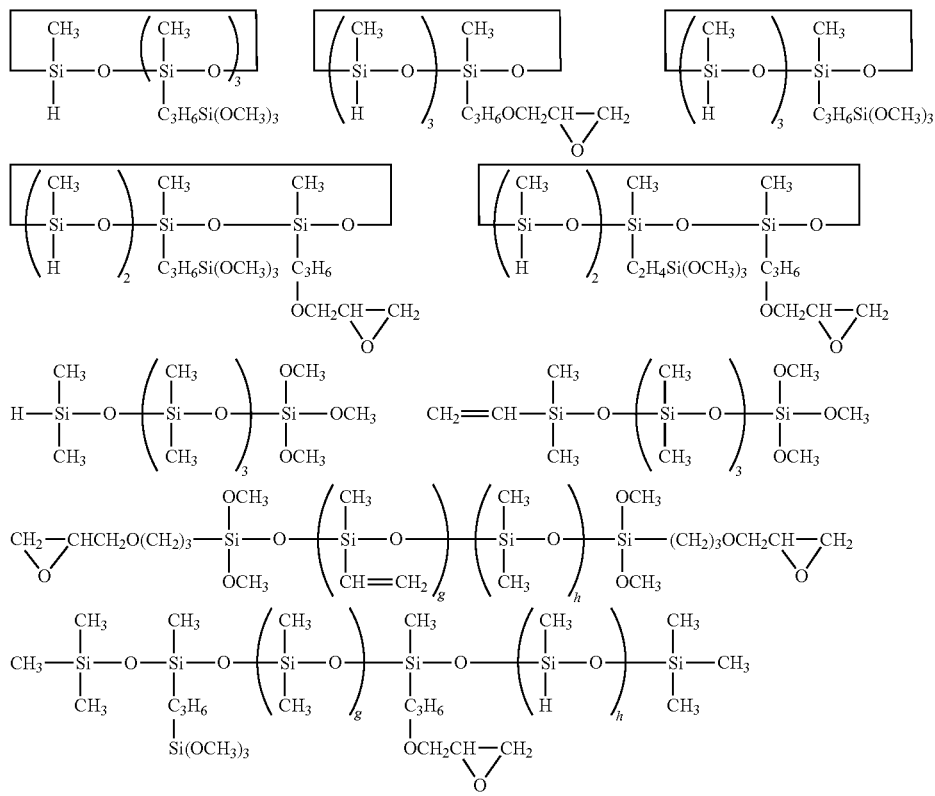

In the afore-mentioned formulas, g and h are each an integer of 1 to 500.

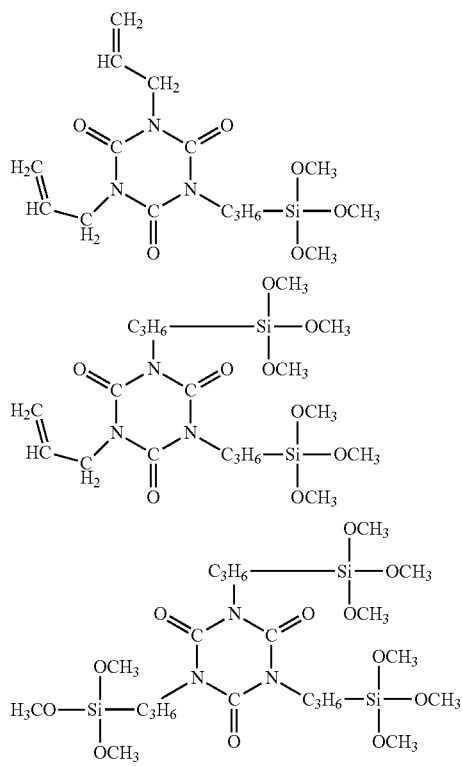

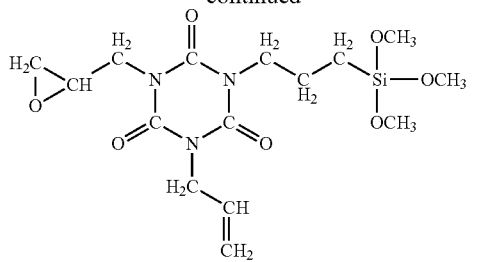

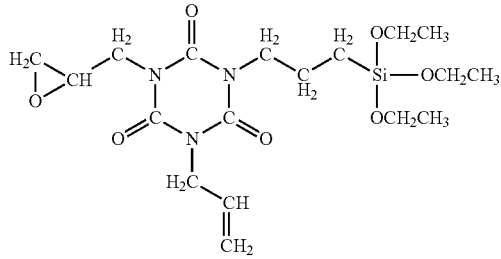

The present silicone resin composition may further comprise conventional additives, if necessary, in addition to components (A) to (F). Examples of the additives include enforcing inorganic fillers such as fumed silica and fumed titanium dioxide, and non-enforcing inorganic fillers such as calcium carbonate, calcium silicate, titanium dioxide, iron (III) oxide, carbon black and zinc oxide. These additives may be properly added in such an amount as not to disturb the purpose of the present invention, for instance, 600 parts by mass or less, relative to total 100 parts by mass of components (A) to (E).

The present silicone resin composition can be obtained by homogeneously blending the afore-mentioned components in a planetary mixer or Shinagawa mixer according to any conventional methods. The present silicone resin composition is usually stored as two separate liquids so that curing does not take place. When used, the two liquids are combined to cure. Alternatively, a small amount of a curing suppressing agent such as acetylene alcohol may be added to store the present composition as one liquid.

The curing conditions for the silicone resin composition of the present invention are not particularly restricted. The present composition cures sufficiently at normal temperature, but may be heated, if necessary. The heating temperature at die bonding is 100 to 250 degrees C., preferably 150 to 200 degrees C. The curing time is 0.1 to 10 seconds, preferably 0.5 to 5 seconds. Further, heating at 80 to 200 degrees C. for 30 minutes to 4 hours is preferred for post curing. The cured product of the present silicone resin composition has low elasticity, specifically a rubber hardness of 40 to 90, preferably 60 to 80, as measured with a type A durometer stipulated in the Japanese Industrial Standards K 6253. Accordingly, stress in a package can be relaxed, so that the composition of the present invention can suitably function as a die-bonding agent.

The present silicone resin composition cures in a short time to give a cured product having excellent adhesion and, therefore, a die-bonding process can be shortened to increase the productivity in the production of semiconductor devices. Further, the cured product of the present silicone resin composition has excellent adhesion to solder resists and copper substrates and low elasticity and, therefore, can provide highly reliable semiconductor devices. The present silicone resin composition can be widely used as a die-bonding agent for semiconductor devices such as IC and LSI.

EXAMPLES

The present invention will be described below in detail, referring to the Examples and the Comparative Examples, but shall not be limited thereto. "Part" means part by mass. A viscosity was determined at 23 degrees C.

Example 1

Fifty parts of the organopolysiloxane (A-1) represented by the following formula (5) having a viscosity of 5,000 mPa·s,

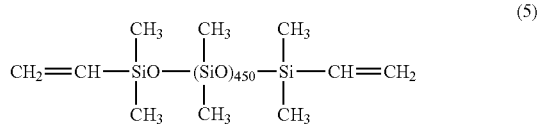

(5)

50 parts of the organopolysiloxane (A-2) having a resin structure composed of 50 mole % of the $SiO_2$ unit, 42.5 mole % of the $(CH_2)_3SiO_{0.5}$ unit and 7.5 mole % of the $Vi_3SiO_{0.5}$ unit, 15 parts of the organohydrogenpolysiloxane represented by the following general formula (6),

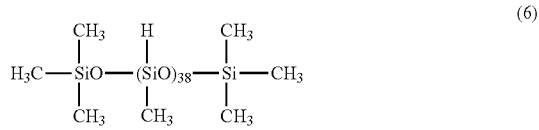

(6)

50 parts of the fine silicone particles treated with silazane, 0.05 part of a solution of the octhyl alcohol-modified chloroplatinic acid (platinum content: 2 mass %) and 1.0 part of 5-ethyl-2-(2-hydroxy-1,1-dimethylethyl)-5-(hydroxymethyl)-1,3-dioxane diacrylate (trade name: Kayarad R-604, ex Nippon Kayaku Co., Ltd.) were mixed in a planetary mixer to prepare a silicone resin composition.

The afore-mentioned silicone resin composition was poured into a mold 3 mm long×3 mm wide×10 mm deep and heat cured at 150 degrees C. for 4 hours to form a cured product. The appearance of the formed product was observed with the naked eye. A tensile strength, a hardness according to the Japanese Industrial Standards K 6253, with a type A spring test instrument, and an elongation ratio were determined. Further, a shear adhesion strength and a cohesive failure ratio with a solder resist were determined in the manner mentioned below. The results are shown in Table 1.

Fine silicone particles treated with silazane were prepared by blending 50 parts of the fine silicone particles (KMP-600, ex Shin-Etsu Chemical Co., Ltd.) having an average particle size of 5 micrometers and coated with a polyorganosilsesquioxane resin with 3 parts of divinyltetramethylsilazane in a planetary mixer at 160 degrees C. for 3 hours and removing the remaining silazane and by-products such as ammonia at 10 Torr.

[Shear Adhesion Strength to a Solder Resist]

The above-mentioned composition was applied to a solder resist substrate 25 mm wide (trade name: AUS308, ex Taiyo Ink Mfg. Co., Ltd.) to form a composition layer 25 micrometers thick and 10 mm long. Then, a silicon wafer substrate (10 mm×10 mm) was die bonded at 200 degrees C. for one second, using a die bonder (ex TOWA), to prepare test samples. Shear adhesion strength of the test sample was determined at 240 degrees C. with a bond tester (ex DAGE, 4000 PXY). The test samples which had the silicon wafer substrate die-bonded were further cured at 150 degrees C. for one hour to prepare cured test samples. Shear adhesion strength of the cured test sample was determined.

[Cohesive Failure Ratio]

A cohesive failure ratio is a percentage of an area of cohesive failure where the solder resist substrate and the cured silicone product do not exfoliate from each other at the interface therebetween and the cured silicone product itself breaks, relative to a whole area of failure surface, in the determination of the afore-mentioned shear adhesion strength of the test sample.

Example 2

A silicone resin composition was prepared in the same manner as in Example 1, except that R-604 was replaced with (octahydro-4,7-methane-1H-indenediyl)bis(methylene) ester of 2-propenoic acid (trade name: Kayarad R-684, ex Nippon Kayaku Co., Ltd.). The results are shown in Table 1.

Example 3

A silicone resin composition was prepared in the same manner as in Example 1, except that R-604 was replaced with lauryl acrylate. The results are shown in Table 1.

Example 4

A silicone resin composition was prepared in the same manner as in Example 1, except that 2 parts of adhesion aid (A) represented by the following formula (7) were further added. The results are shown in Table 1.

(7)

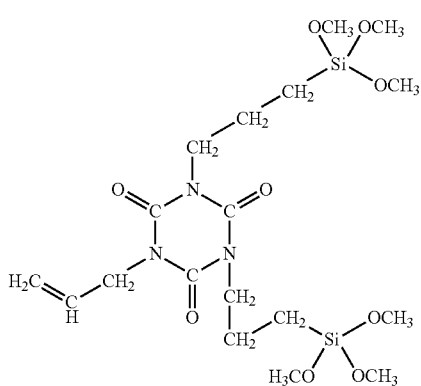

Example 5

A silicone resin composition was prepared in the same manner as in Example 1, except that 2 parts of adhesion aid (B) represented by the following formula (8) were added. The results are shown in Table 1.

(8)

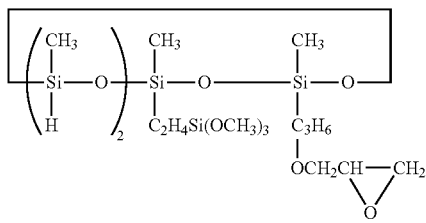

Example 6

Fifty parts of the organopolysiloxane (A-1) represented by the afore-mentioned formula (5), 50 parts of the organopolysiloxane (A-3) having a resin structure composed of 50 mole % of the $SiO_2$ unit, 42.5 mole % of the $(CH_3)_3SiO_{0.5}$ unit and 7.5 mole % of the $ViMe_2SiO_{0.5}$ unit, 5 parts of the organohydrogenpolysiloxane represented by the afore-mentioned general formula (6), 50 parts of fine silicone particles treated with silazane, 0.05 part of a solution of octhyl alcohol-modified chloroplatinic acid (platinum content: 2 mass %), 1.0 part of 5-ethyl-2-(2-hydroxy-1,1-dimethylethyl)-5-(hydroxymethyl)-1,3-dioxane diacrylate (trade name: Kayarad R-604, ex Nippon Kayaku Co., Ltd.) and 2 parts of adhesion aid (A) represented by the afore-mentioned formula (7) were mixed in a planetary mixer to prepare a silicone resin composition. The results are shown in Table 1.

Comparative Example 1

A silicone resin composition was prepared in the same manner as in Example 1, except that R-604 was not added. The results are shown in Table 1.

Comparative Example 2

A silicone resin composition was prepared in the same manner as in Example 4, except that R-604 was not added. The results are shown in Table 1.

TABLE 1

| | | | Example | | | |
|---|---|---|---|---|---|---|
| | Component, part by mass | | 1 | 2 | 3 | 4 |
| (A) | Organopolysiloxane(A-1) | | 50 | 50 | 50 | 50 |
| | Organopolysiloxane(A-2) | | 50 | 50 | 50 | 50 |
| | Organopolysiloxane(A-3) | | | | | |
| (B) | Oraganohydrogenpolysiloxane | | 15 | 15 | 15 | 15 |
| | SiH group/SiVi group mole ratio | | 1.5 | 1.5 | 1.5 | 1.5 |
| (C) | Catalyst comprising a platinum group metal | | 0.05 | 0.05 | 0.05 | 0.05 |
| (D) | Fine silicone particles | | 50 | 50 | 50 | 50 |
| (E) | (Meth)acrylate | Kayarad R-604 | 1.0 | | | 1.0 |
| | | Kayarad R-684 | | 1.0 | | |
| | | Lauryl acrylate | | | 1.0 | |
| (F) | Adhesion aid | A | | | | 2 |
| | | B | | | | |
| Evaluation of properties | Appearance | | Colorless and transparent | Colorless and transparent | Colorless and transparent | Colorless and transparent |
| | Hardness | TypeA | 70 | 71 | 70 | 70 |
| | Elongation | % | 30 | 30 | 30 | 30 |
| | Tensile strength | Mpa | 7 | 7 | 7 | 8 |
| | Shear adhesion strength to solder resist (Curing conditions: 200° C./1 sec.) | MPa | 2 | 2 | 3 | 3 |
| | Cohesive failure (Curing conditions: 200° C./1 sec.) | % | 80 | 80 | 90 | 100 |
| | Shear adhesion strength to solder resist (Curing conditions: 150° C./1 h.) | Mpa | 5 | 5 | 5 | 6 |

TABLE 1-continued

|  |  |  | Cohesive failure (Curing conditions: 150° C./1 h) | % | 100 | 100 | 100 | 100 |

| | | | | Example | | Comparative Example | |
|---|---|---|---|---|---|---|---|
| | Component, part by mass | | 5 | 6 | 1 | 2 |
| (A) | Organopolysiloxane(A-1) | | 50 | 50 | 50 | 50 |
| | Organopolysiloxane(A-2) | | 50 | | 50 | 50 |
| | Organopolysiloxane(A-3) | | | 50 | | |
| (B) | Oraganohydrogenpolysiloxane | | 15 | 15 | 15 | 15 |
| | SiH group/SiVi group mole ratio | | 1.5 | 1.5 | 1.5 | 1.5 |
| (C) | Catalyst comprising a platinum group metal | | 0.05 | 0.05 | 0.05 | 0.05 |
| (D) | Fine silicone particles | | 50 | 50 | 50 | 50 |
| (E) | (Meth)acrylate | Kayarad R-604 | 1.0 | 1.0 | | |
| | | Kayarad R-684 | | | | |
| | | Lauryl acrylate | | | | |
| (F) | Adhesion aid | A | | 2 | | 2 |
| | | B | 2 | | | |
| Evaluation of properties | Appearance | | Colorless and transparent | Colorless and transparent | Colorless and transparent | Colorless and transparent |
| | Hardness | TypeA | 70 | 60 | 70 | 71 |
| | Elongation | % | 20 | 50 | 30 | 30 |
| | Tensile strength | Mpa | 7 | 5 | 6 | 7 |
| | Shear adhesion strength to solder resist (Curing conditions: 200° C./1 sec.) | MPa | 3 | 2 | 0.01 | 0.05 |
| | Cohesive failure (Curing conditions: 200° C./1 sec.) | % | 100 | 100 | 0 | 0 |
| | Shear adhesion strength to solder resist (Curing conditions: 150° C./1 h.) | Mpa | 5 | 4.5 | 5 | 5 |
| | Cohesive failure (Curing conditions: 150° C./1 h) | % | 100 | 100 | 100 | 100 |

As seen in Table 1, the test samples which were die bonded in a short time using the silicone resin composition which did not comprise any (meth)acrylate compound showed the poor adhesion strength to the solder resist substrate (Comparative Examples 1 and 2), while those which were die bonded in a short time using the present silicone resin composition showed the excellent adhesion strength to the solder resist substrate (Examples 1 to 5).

INDUSTRIAL APPLICABILITY

The present silicone resin composition cures in a short time to form a cured product having an excellent adhesion and, therefore, a die-bonding process can be shortened to increase the productivity in the production of semiconductor devices. Further, the cured product of the present silicone resin composition has excellent adhesion to solder resists and copper substrates and low elasticity and, therefore, can provide highly reliable semiconductor devices. The present silicone resin composition can be widely used as a die-bonding agent for semiconductor devices such as IC and LSI.

The invention claimed is:

1. A silicone resin composition comprising
(A) an organopolysiloxane having at least two alkenyl groups in a molecule,
(B) an organohydrogenpolysiloxane having, in a molecule, at least two hydrogen atoms each bonded to a silicon atom in such an amount that a ratio of a total mole of the hydrogen atoms bonded to the silicon atom in component (B) to a total mole of the alkenyl groups in component (A) is 0.1 to 4.0,
(C) a catalytic amount of a catalyst comprising a platinum group metal,
(D) 30 to 80 parts by mass, relative to total 100 parts by mass of components (A) and (B), of spherical fine silicone particles which have been subjected to coating with a polyorganosilsesquioxane resin and then silylation with vinylsilazane, said silicone particles having an average particle size of 0.1 to 100 micrometers and
(E) 0.01 to 10 parts by mass, relative to total 100 parts by mass of components (A) and (B), of a (meth)acrylate compound.

2. The silicone resin composition according to claim 1, wherein component (A) comprises
an organopolysiloxane represented by the following general formula (1):

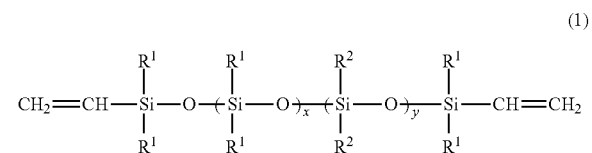

wherein $R^1$ is, independently of each other, an unsubstituted or substituted monovalent hydrocarbon group; $R^2$ is, independently of each other, an unsubstituted or substituted, monovalent hydrocarbon group having no aliphatic unsaturated bond; x and y are 0 or a positive integer and satisfy the following equations $0<x+y<=10,000$ and $0<=x/(x+y)<=1.0$; and
an organopolysiloxane comprising an $SiO_2$ unit, an $R^3_k R^4_p SiO_{0.5}$ unit and an $R^4_3 SiO_{0.5}$ unit, wherein $R^3$ is a vinyl or allyl group, $R^4$ is a monovalent hydrocarbon group having no alkenyl group, k is 1, 2 or 3, p is 0, 1 or 2, provided that a total of k and p is 3, wherein an amount of the latter organopolysiloxane is 20 to 70% by mass, relative to the amount of component (A).

3. The silicone resin composition according to claim 1, further comprising (F) an adhesion aid.

4. A cured silicone product obtained by curing a silicone resin composition comprising
   (A) an organopolysiloxane having at least two alkenyl groups in a molecule,
   (B) an organohydrogenpolysiloxane having, in a molecule, at least two hydrogen atoms each bonded to a silicon atom in such an amount that a ratio of a total mole of the hydrogen atoms bonded to the silicon atom in component (B) to a total mole of the alkenyl groups in component (A) is 0.1 to 4.0,
   (C) a catalytic amount of a catalyst comprising a platinum group metal,
   (D) 30 to 80 parts by mass, relative to total 100 parts by mass of components (A) and (B), of spherical fine silicone particles which have been subjected to coating with a polyorganosilsesquioxane resin and then silylation with vinylsilazane, said silicone particles having an average particle size of 0.1 to 100 micrometers, and
   (E) 0.01 to 10 parts by mass, relative to total 100 parts by mass of components (A) and (B), of a (meth)acrylate compound.

5. The cured silicone product according to claim 4, having a rubber hardness of 40 to 90 according to a type A durometer stipulated in the Japanese Industrial Standards K 6253.

6. A semiconductor device sealed with the cured silicone product according to claim 4 or 5.

* * * * *